(12) United States Patent
Thombre

(10) Patent No.: US 11,532,774 B2
(45) Date of Patent: Dec. 20, 2022

(54) LIGHT ASSEMBLY AND LENS WITH REVOLVED COLLIMATOR PROFILE

(71) Applicant: North American Lighting, Inc., Paris, IL (US)

(72) Inventor: Ashwin Thombre, Farmington Hills, MI (US)

(73) Assignee: NORTH AMERICAN LIGHTING, INC., Paris, IL (US)

(*) Notice: Subject to any disclaimer, the term of this patent is extended or adjusted under 35 U.S.C. 154(b) by 0 days.

(21) Appl. No.: 17/197,293

(22) Filed: Mar. 10, 2021

(65) Prior Publication Data

US 2021/0202807 A1 Jul. 1, 2021

Related U.S. Application Data

(63) Continuation of application No. 16/416,257, filed on May 19, 2019, now Pat. No. 10,957,829.

(51) Int. Cl.
| | |
|---|---|
| *F21V 5/04* | (2006.01) |
| *H01L 33/58* | (2010.01) |
| *G02B 27/09* | (2006.01) |
| *G02B 27/30* | (2006.01) |

(52) U.S. Cl.
CPC .......... *H01L 33/58* (2013.01); *G02B 27/0955* (2013.01); *G02B 27/30* (2013.01)

(58) Field of Classification Search
CPC . F21V 7/0091; F21V 7/09; F21V 5/04; F21V 5/045; F21V 13/04; F21K 9/69; G02B 2003/0093; G02B 3/08
See application file for complete search history.

(56) References Cited

U.S. PATENT DOCUMENTS

| | | | | |
|---|---|---|---|---|
| 1,081,215 A | * | 12/1913 | Coulson | G02B 19/0028 362/327 |
| 2,215,900 A | | 9/1940 | Bitner | |
| 2,254,961 A | * | 9/1941 | Lawrence | F21V 13/04 362/327 |
| 2,356,654 A | * | 8/1944 | Cullman | F21V 7/0091 362/223 |
| 4,767,172 A | * | 8/1988 | Nichols | F21V 7/0091 355/1 |
| 5,173,810 A | * | 12/1992 | Yamakawa | F21V 7/0091 359/819 |
| 5,526,190 A | * | 6/1996 | Hubble, III | F21V 7/0091 347/102 |

(Continued)

FOREIGN PATENT DOCUMENTS

| | | |
|---|---|---|
| WO | 2018020218 A1 | 2/2018 |
| WO | 2018166911 A1 | 9/2018 |

*Primary Examiner* — Ismael Negron
(74) *Attorney, Agent, or Firm* — Brooks Kushman P.C.

(57) ABSTRACT

A light assembly includes a light source and a lens with a light-incident face defined by a central primary collector surface and secondary input surfaces extending transversely from the central primary collector surface, a light-emitting face opposite the light-incident face and defined by a central collimator profile and a pair of lateral side projections extending transversely from the central collimator profile, and a pair of secondary collecting surfaces extending between the light-incident face and the light-emitting face. Light from the light source received by the lens and exits as a generally collimated output.

18 Claims, 2 Drawing Sheets

(56) References Cited

U.S. PATENT DOCUMENTS

| | | | |
|---|---|---|---|
| 5,757,557 A * | 5/1998 | Medvedev | G02B 19/0047 359/708 |
| 6,811,277 B2 | 11/2004 | Amano | |
| 6,819,505 B1 | 11/2004 | Cassarly et al. | |
| 6,827,467 B2 * | 12/2004 | Tenmyo | G03B 15/05 362/268 |
| 7,213,945 B2 * | 5/2007 | Yoneda | H01L 33/58 362/309 |
| 7,401,948 B2 | 7/2008 | Chinniah et al. | |
| 7,473,013 B2 * | 1/2009 | Shimada | F21V 7/0091 362/327 |
| 7,580,192 B1 | 8/2009 | Chu et al. | |
| 7,641,365 B2 * | 1/2010 | Katzir | G02B 19/0066 362/327 |
| 7,837,349 B2 | 11/2010 | Chinniah et al. | |
| 7,901,108 B2 * | 3/2011 | Kabuki | G02B 6/0018 362/235 |
| 8,310,685 B2 | 11/2012 | Dimitrov-Kuhl et al. | |
| 8,419,226 B2 | 4/2013 | Fu et al. | |
| 8,714,770 B2 | 5/2014 | Kato et al. | |
| 10,957,829 B2 * | 3/2021 | Thombre | H01L 33/58 |
| 2004/0264196 A1 | 12/2004 | Shu | |
| 2019/0162389 A1 | 5/2019 | Shah | |

* cited by examiner

LIGHT ASSEMBLY AND LENS WITH REVOLVED COLLIMATOR PROFILE

CROSS-REFERENCE TO RELATED APPLICATIONS

This application is a continuation of U.S. application Ser. No. 16/416,257 filed May 19, 2019, now issued as U.S. Pat. No. 10,957,829 on Nov. 19, 2020, the disclosure of which is hereby incorporated in its entirety by reference herein.

TECHNICAL FIELD

The present application relates to a lens and light assembly.

BACKGROUND

In vehicle lamps, such as headlamps, there is often tradeoff between efficiency and size when design lighting functions. Packaging constraints in vehicles often limit the lens size; however, the lamp is still required to meet light output requirements.

SUMMARY

According to one embodiment, a light assembly is provided have a light source and a lens body. The lens body has a light-incident face positioned adjacent the light source, and a light-emitting face opposite the light-incident face. The light-incident face is defined by a collimator profile revolved about a transverse axis perpendicular to the central optical axis forming a revolved collimator profile surface receiving light emitted.

In another embodiment, the light-emitting face is defined by a central collimating surface protruding from upper and lower secondary output surfaces. The light-emitting face receives light internal to the lens body and refracts a light output pattern being generally collimated in the forward direction. A pair of secondary collecting surfaces extend between the light-incident face and the light-emitting face. The secondary collecting surfaces are oriented to reflect light internal to the lens body in the forward direction.

In another embodiment, the revolved collimator profile surface has a central collimator contour and lateral side projections extending transversely from the central collimator contour.

In another embodiment, a primary collecting surface is defined by the central collimator contour and collimates at least a portion of the emitted light.

In another embodiment, secondary input surfaces are defined by the lateral side projections, wherein light incident on the secondary input surfaces is refracted, then reflected into the lens body through total internal reflection.

In another embodiment, the collimator profile is revolved about the transverse axis and defines the light-incident face as a light-incident cavity.

In another embodiment, the primary collecting surface is positioned within the cavity.

In another embodiment, an opening to the cavity is symmetric about the transverse axis and an upright direction.

In another embodiment, the light source is configured to be positioned at an opening to the cavity.

In another embodiment, the collimator profile is revolved about the transverse axis a radial distance generally equal to a radial distribution of the light source.

In another embodiment, the light source has a light emitting diode (LED) having a hemispherical light pattern with the radial distribution being generally 180-degrees.

In another embodiment, the collimator profile is revolved about the transverse axis in the range of 120-degrees to 180-degrees.

In another embodiment, the central collimating surface of the light-emitting face is a curved protrusion having a curvature in an upright direction, wherein the curvature is generally constant in the in a transverse direction.

In another embodiment, the upper and lower secondary output surfaces extend from upper and lower edges of the curvature.

In another embodiment, the upper and lower secondary output surfaces are generally planar.

According to at least one embodiment, a lens is provided with a light-incident face and a light-emitting face opposite the light-incident face. The light-incident face is defined by a collimator profile revolved about a transverse axis perpendicular to the central optical axis. A revolved collimator profile surface receives light emitted from the light source.

In another embodiment, a pair of secondary collecting surfaces extend between the light-incident face and the light-emitting face. The secondary collecting surfaces are oriented to reflect light internal to the lens body in the forward direction. The light-emitting face is defined by a central collimating surface protruding from upper and lower secondary output surfaces. The light-emitting face receives light internal to the lens body and refracts a light output pattern being generally collimated in the forward direction.

According to at least one embodiment, a lens is provided with a light-incident face and a light-emitting face opposite the light-incident face. The lens body has a central optical axis extending in a forward direction through the light-incident face and the light-emitting face. The light-incident-face has a primary collector surface defined by a collimator profile revolved about a transverse axis perpendicular to the central optical axis. A pair of secondary collecting surfaces extend between the light-incident face and the light-emitting face, the secondary collecting surfaces oriented to reflect light internal to the lens body in the forward direction through total internal reflection. The light-emitting face is defined by a central primary collimating output surface protruding from upper and lower secondary output surfaces.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
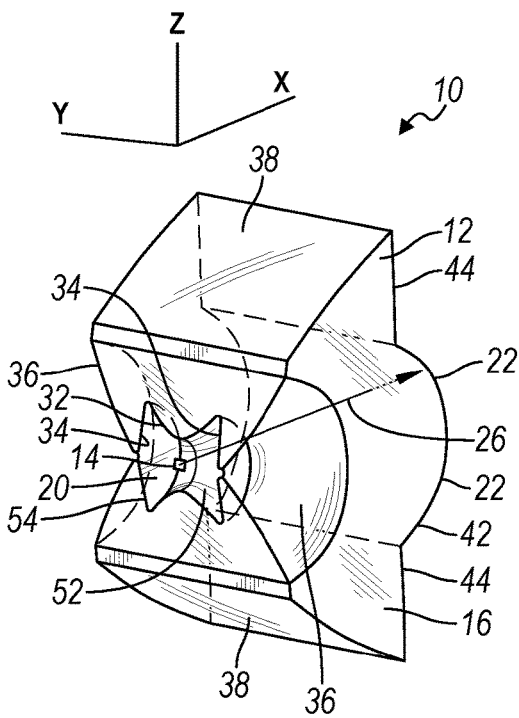
FIG. 1 is a rear perspective view of a lens according to one embodiment of the present application.

FIG. 1 illustrates a rear perspective view of a light assembly 10 having a lens 12 and at least one light source 14. The lens 12 has a lens body 16, which has a light-incident face 20 for receiving light from the light source 14, and a light-emitting face 22 opposite the light-incident face 20. A central optical axis 26 extends in a forward direction X, through the light-incident face and the light-emitting face. The lens body 16 may be formed of optical transmissive material. For example, the lens body 16 may be made of a lightweight and robust plastic material such as polycarbonate or acrylic or any suitable material known in the art.

Figure 3:
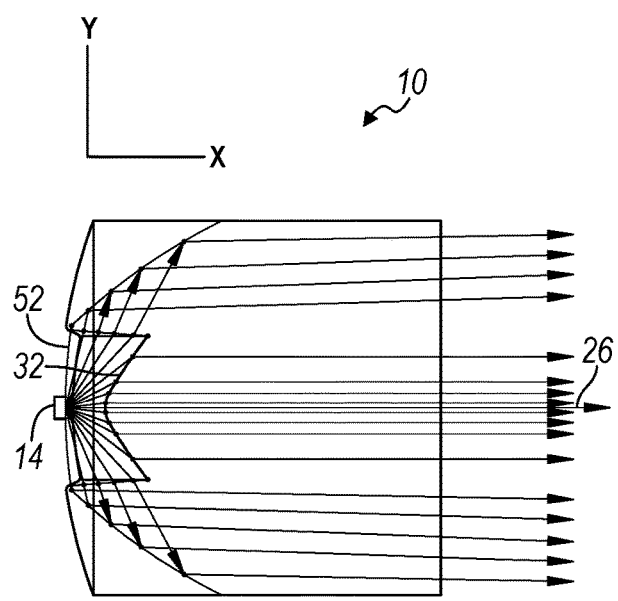
FIG. 3 is a top view of the lens of FIG. 1. A bottom view of the lens is symmetric to the top view.

The light-incident face 20 is defined by a collimator profile 30. The collimator profile 30 is revolved about a transverse axis Y that is perpendicular to the central optical axis 26 to form the light-incident face 20. The revolved collimator profile forms a central primary light-incident surface 32, secondary light-incident surfaces 34, and total internal reflection surfaces 36. The primary light-incident surface 32 is formed as a collimating surface configured to receive input light from the light source 14 and refract collimated light into the lens body. In the XY plane, the primary light-incident surface 32 receives the light distribution having a spread in the transverse direction Y and collimates light in the forward direction X, as shown in FIG. 3. The secondary light-incident surface 34 is formed as a refracting surface configured to receive input light from the light source 14. The total internal reflection surfaces 36 are configured to reflect light refracted by the secondary light-incident surface 34 in the X direction in the XY plane as shown in FIG. 3. The primary light-incident surface 32 and the secondary light-incident surfaces 34 may share a focal point.

The light-incident face 20 is formed so that it directs light collected from the light source 14 into the lens body toward a pair of secondary collecting surfaces 38. The secondary collecting surfaces 38 form the upper and lower lens surfaces positioned on opposite sides of the lens body 16. The secondary collecting surfaces 38 define total internal reflection (TIR) surfaces that collect and reflect light internal to the lens body in the forward direction X.

Figure 5A:
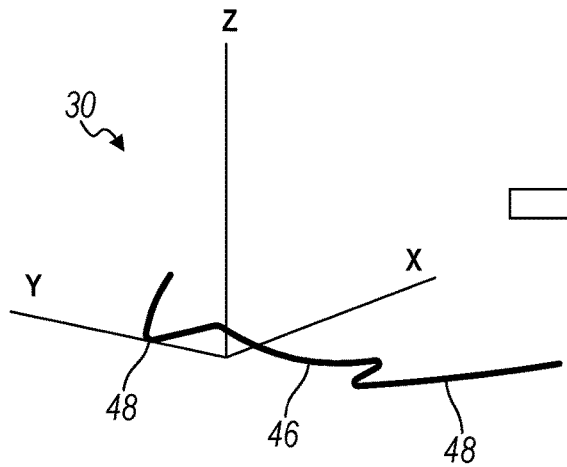
FIGS. 5A-5D are portions of the lens of FIG. 1 in exploded views to illustrate the construction of the lens.

As shown in FIG. 5A, the collimator profile 30 is defined in the XY plane. The collimator profile 30 has a central collimator contour 46 and lateral side projections 48 extending from transverse sides of the central collimator contour 46. The focal length and width of the profile may be adjusted to optimize light collection within the overall width constraints of the lens.

Figure 5B:
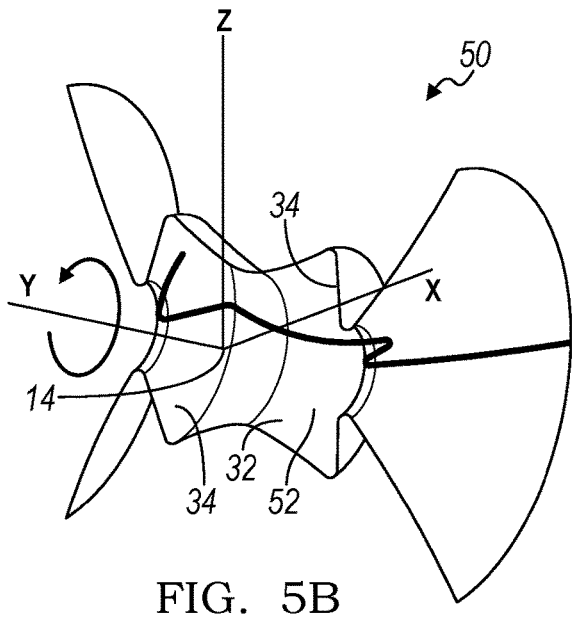

As illustrated in FIG. 5B, the collimator profile 30 is revolved about the transverse axis Y. The collimator profile 30 is revolved about the transverse axis Y a radial distance generally equal to a radial spread of the light source 14. In one embodiment, the collimator profile 30 is revolved about the transverse axis in the range of 120-degrees to 180-degrees. However, the collimator profile 30 may be revolved any suitable radial distance based on the light source or other design parameters. The light source 14 may be a semiconductor light emitting unit, such as a light emitting diode (LED) in which a rectangular light emitting chip emits a generally hemispherical light distribution. The LED may be oriented to have central optical axis directed along the optical axis 26. The light source 14 is not limited to a specific type of light source such as an LED, and any type of light source or semiconductor light source may be used such as a semiconductor device chip or a semiconductor light-emitting device which is sealed in a package or coated with a coating material etc.

As the collimator profile 30 is revolved, the revolved collimator surface 50 is formed, as shown in FIG. 5B. The revolved collimator surface 50 forms the primary light-incident surface 32, defined by the revolved collimator contour 46. Similarly, the revolved collimator surface 50 forms the secondary light-incident surfaces 34 and total internal reflection surface 36 defined by the lateral side projections 48. The revolved collimator surface 50 forms a light-incident cavity 52. The primary light-incident surface 32 and the secondary light-incident surface 34 are positioned within the cavity 52.

As shown in FIG. 1, the revolved profile defines an opening 54 to the cavity 52. The opening 54 is symmetric about the transverse direction Y and the upright direction Z. The opening 54 has a bow-tie shape and is defined by upper and lower collimator profiles positioned opposite each other. The collimator profiles 30 are spaced apart and define the upper and lower opening portions. The lateral side projections 48 of the upper and lower collimator profiles 30 are positioned adjacent a transverse centerline of the opening. As shown in the Figures, the light source 14 is positioned at an opening 54 to the cavity 52. In another embodiment, the light source 14 may be positioned within the cavity 52, or the light source may be positioned outside the opening 54. The light source 14 may be located at the one focal point of the surfaces 32, 34. The light source 14 may be located along the optical axis 26 and along an axis of symmetry of the opening 54 or the cavity 52. It is possible for the LED to be placed at a position other than the optical axis 26 and other than the axis of symmetry of the opening 54 or the cavity 52, depending on the type of beam pattern needed.

Figure 4:
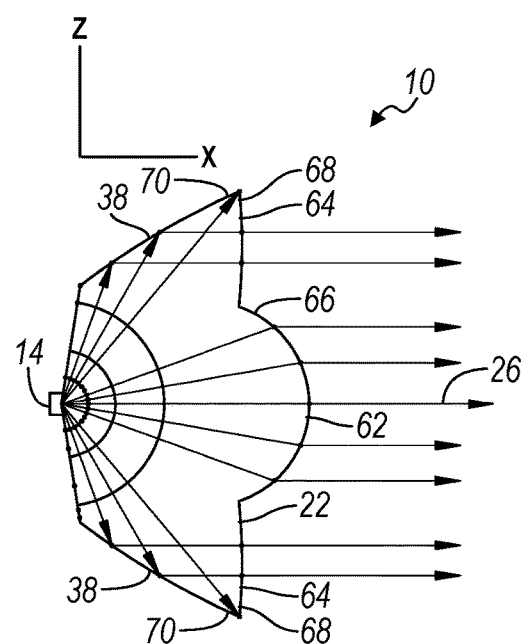
FIG. 4 is a side view of the lens of FIG. 1. The right-side view is symmetric to the left-side view.

The upper and lower secondary collecting surfaces 38 extend between the light-incident face 20 and the light-emitting face 22. The light-emitting face 22 receives light internal to the lens body and emits a light output pattern being generally collimated in the forward direction. As shown in FIG. 4, the light-emitting face 22 is defined by a central primary output surface 62 protruding forward from upper and lower secondary output surfaces 64.

Figure 2:
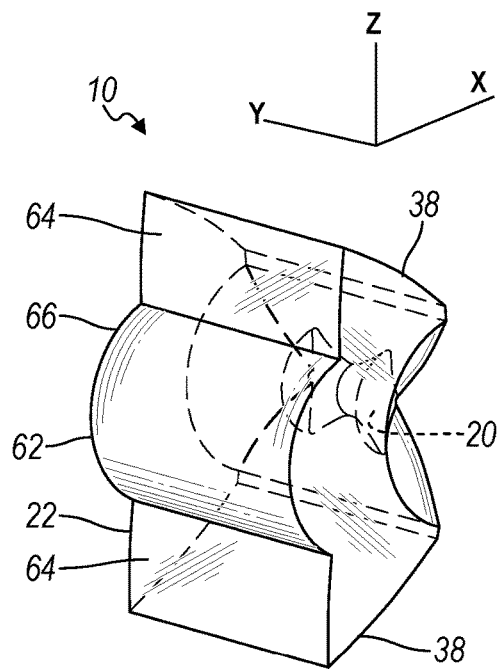
FIG. 2 is a front perspective view of the lens of FIG. 1.

The primary output surface 62 is a central collimating surface having a convex curvature 66 in the upright direction Z. As shown in FIG. 2, the curvature 66 of the protrusion is generally constant in the transverse direction Y. As such, the convex curvature 66 forms a partially cylindrical protrusion. The convex curvature 66 may be defined by a portion of a circle, or may be a free form curvature that collimates The secondary output surfaces 64 extend from upper and lower edges of the curvature 66. As shown in FIG. 4, the upper and lower secondary output surfaces 64 may be generally planar. In another embodiment, the upper and lower secondary output surfaces 64 may have a curvature along the upright direction Z to ensure output light is generally parallel to the optical axis 26. Outer edges 68 of the secondary output surfaces 64 are connected to forward edges 70 of the upper and lower collecting surfaces 38.

Figure 5D:
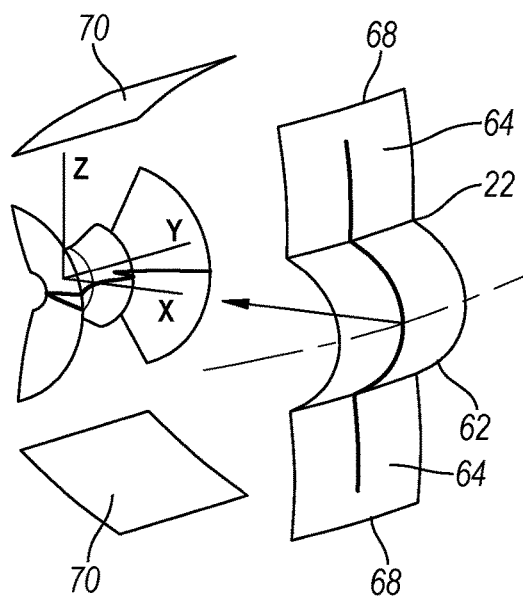
Figure 5C:
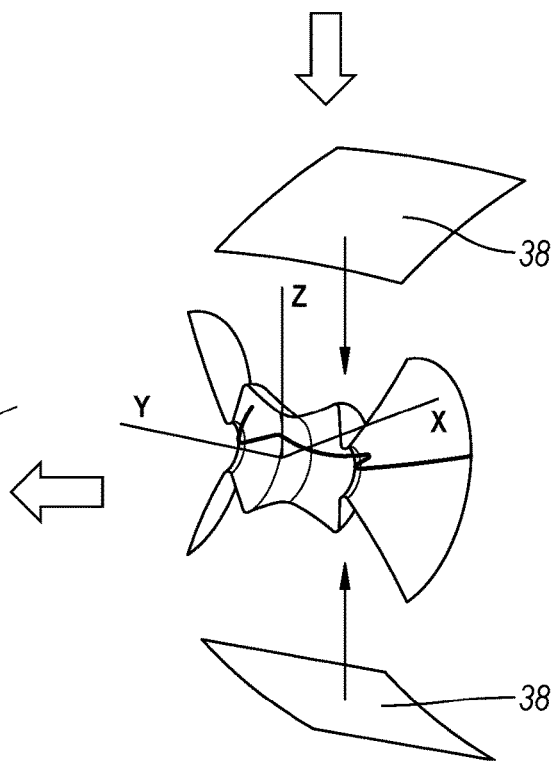

FIGS. 5A-5D illustrate the geometry and construction of the lens 12. The collimator profile 30 is defined in the XY plane, as shown in FIG. 5A. The collimator profile 30 is revolved about the transverse axis Y, as shown in FIG. 5B to define the revolved collimator surface 50. As shown in FIG. 5C, the upper and lower secondary collecting surfaces 38 are added to the revolved collimator surface 50. In FIG. 5D, the light-emitting face 22 is added.

The lens 12 provides high efficiency output for beam patterns such as high-beam patterns in vehicle headlamps. For example, the light assembly 10 with the lens 12 and a LED light source 14 may have over fifty-percent efficiency. The light assembly 10 may be used in other automotive exterior lighting functions, or other lighting applications.

The lens 12 has a small aspect ratio which allows for ease of packaging in the width (Y-dimension) and height (Z dimension) directions. In one example, the lens 12 may have an aspect ratio with a width of 20 millimeters (mm) and a height of 50 mm. In another example, the lens 12 may have a width of 30 mm and height of 45 mm. Multiple lens elements 12 may be used to meet various photometry or output requirements. Multiple lens elements can be used for low and high beams as well as to for the same beam pattern.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A lens comprising:
    a light-incident face for receiving light from a and defined by a collimator profile revolved about a transverse axis perpendicular to a central optical axis by a revolved angle, wherein the light-incident face defines a cavity having an opening configured to receive light from the light source, wherein the opening to the cavity is symmetric about the transverse axis and a lateral axis perpendicular to both the central optical axis and the transverse axis;
    a light-emitting face opposite the light-incident face; and
    a lens body defined between the light-incident faces and the light-emitting face, with the central optical axis extending in a forward direction through the light-incident face and the light-emitting face.

2. The lens of claim 1, wherein the collimator profile is revolved about the transverse axis in the range of 120-degrees to 180-degrees.

3. The lens of claim 1, the lens body having a pair of secondary collecting surfaces extending between the light-incident face and the light-emitting face, the pair of secondary collecting surfaces oriented to reflect light internal to the lens body in the forward direction.

4. The lens of claim 1, wherein the light-emitting face is defined by a central collimating surface protruding from upper and lower secondary output surfaces, the light-emitting face receives light internal to the lens body and refracts a light output pattern being generally collimated in the forward direction.

5. The lens of claim 1, wherein the light-incident face comprises:
    a primary collecting surface to collimate at least a portion of light received from the light source; and
    lateral side projections defining secondary input surfaces, wherein light incident on the secondary input surfaces is refracted and then reflected in the lens body through total internal reflection.

6. The lens of claim 1, wherein the light-emitting face comprises:
    a central collimator surface formed by a curved protrusion having a curvature along the lateral axis perpendicular to both the central optical axis and the transverse axis, wherein the curved protrusion is generally constant along the transverse axis; and
    upper and lower secondary output surfaces extend from upper and lower edges of the curved protrusion.

7. The lens of claim 6, wherein the upper and lower secondary output surfaces are generally planar.

8. A light assembly comprising:
    a light source; and
    a lens body positioned adjacent the light source and having a light-incident face for receiving light emitted from the light source, the light-incident face defined by a collimator profile revolved by a revolved angle about a transverse axis perpendicular to a central optical axis, wherein the light-incident face defines a cavity having an opening configured to receive light from the light source, wherein the opening to the cavity is symmetric about the transverse axis and a lateral axis perpendicular to both the central optical axis and the transverse axis.

9. The light assembly of claim 8, wherein the collimator profile is revolved about the transverse axis by the revolved angle in the range of 120-degrees to 180-degrees.

10. The light assembly of claim 8, wherein the collimator profile is revolved about the transverse axis, wherein the revolved angle is in the range of 120-degrees to 180-degrees.

11. The light assembly of claim 8, wherein the light source comprises a light emitting diode (LED) having a hemispherical light pattern with the radial distribution being generally 180-degrees, and wherein the collimator profile is revolved about the transverse axis a radial distance generally equal to the radial distribution of the LED.

12. The lens of claim 1, wherein the collimator profile is revolved about the transverse axis by the revolved angle in the range of 120-degrees to 180-degrees.

13. The light assembly of claim 8, wherein the lens body has a light-emitting face opposite the light-incident face such that the central optical axis extends in a forward direction through the light-incident face and the light-emitting face, wherein light incident on the light-incident face is directed at least partially to the light-emitting face by total internal reflection.

14. The light assembly of claim 13, the light-emitting face further having upper and lower secondary output surfaces and a central collimating surface protruding from and between the upper and lower secondary output surface, wherein an output pattern from the light-emitting face is generally collimated in the forward direction.

15. The light assembly of claim 13, wherein the light-emitting face includes a central collimating surface with a curved protrusion having a curvature in a direction away from the light source, wherein the curvature is generally constant in a transverse direction.

16. The light assembly of claim 8, wherein the light-incident face comprises a central primary collecting surface and lateral side surfaces extending transversely from the central primary collecting surface.

17. The light assembly of claim 16, wherein the central primary collecting surface is configured to collimate at least a portion of the incident light.

18. The light assembly of claim 16, wherein secondary input surfaces are defined by the lateral side surfaces, wherein light incident on the secondary input surfaces is refracted, then reflected into the lens body through total internal reflection.

* * * * *

UNITED STATES PATENT AND TRADEMARK OFFICE
CERTIFICATE OF CORRECTION

| | |
|---|---|
| PATENT NO. | : 11,532,774 B2 |
| APPLICATION NO. | : 17/197293 |
| DATED | : December 20, 2022 |
| INVENTOR(S) | : Ashwin Thombre et al. |

It is certified that error appears in the above-identified patent and that said Letters Patent is hereby corrected as shown below:

In the Claims

Column 5, Line 27, Claim 1:
After "a light-incident face for receiving light from a"
Insert -- light source --.

Signed and Sealed this
Twelfth Day of March, 2024

Katherine Kelly Vidal
*Director of the United States Patent and Trademark Office*